United States Patent
Sakamoto et al.

(10) Patent No.: US 8,258,637 B2
(45) Date of Patent: Sep. 4, 2012

(54) BONDING STRUCTURE AND METHOD FOR MANUFACTURING SAME

(75) Inventors: Eiji Sakamoto, Fujisawa (JP); Shohei Hata, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/964,907

(22) Filed: Dec. 10, 2010

(65) Prior Publication Data
US 2011/0139856 A1 Jun. 16, 2011

(30) Foreign Application Priority Data
Dec. 11, 2009 (JP) ................. 2009-281118

(51) Int. Cl.
*H01L 23/29* (2006.01)
(52) U.S. Cl. ........ 257/794; 257/737; 257/738; 257/778; 257/779
(58) Field of Classification Search .......... 257/777–780, 257/737–738, 794
See application file for complete search history.

(56) References Cited

U.S. PATENT DOCUMENTS

| | | | | | |
|---|---|---|---|---|---|
| 4,921,157 | A | * | 5/1990 | Dishon et al. | 228/124.1 |
| 5,274,913 | A | * | 1/1994 | Grebe et al. | 29/840 |
| 5,924,623 | A | * | 7/1999 | Kenney | 228/180.22 |
| 5,940,728 | A | * | 8/1999 | Katayama et al. | 438/612 |
| 5,976,302 | A | * | 11/1999 | Oppermann et al. | 156/299 |
| 6,050,481 | A | * | 4/2000 | Chapman et al. | 228/254 |
| 6,127,731 | A | * | 10/2000 | Hoffmeyer | 257/750 |
| 6,209,196 | B1 | * | 4/2001 | Ozono et al. | 29/840 |
| 6,337,445 | B1 | * | 1/2002 | Abbott et al. | 174/260 |
| 6,471,115 | B1 | * | 10/2002 | Ijuin et al. | 228/180.22 |
| 6,712,260 | B1 | * | 3/2004 | Kuo et al. | 228/180.22 |
| 6,717,245 | B1 | * | 4/2004 | Kinsman et al. | 257/678 |
| 6,774,314 | B2 | * | 8/2004 | Toyoshima et al. | 174/260 |
| 6,805,279 | B2 | * | 10/2004 | Lee et al. | 228/220 |

FOREIGN PATENT DOCUMENTS

| | | |
|---|---|---|
| JP | 05-074778 | 3/1993 |
| JP | 10-303245 | 11/1998 |
| JP | 2003-224163 | 8/2003 |
| JP | 2007-200982 | 8/2007 |
| JP | 2009-182238 | 8/2009 |

OTHER PUBLICATIONS

Japanese Office Action mailed May 8, 2012 in connection with Japanese Patent Application No. 2009-281118, 2 pages; Japanese Patent Office, Japan.

Korean Office Action mailed Jul. 11, 2012, in connection with Korean Patent Application No. 10-2010-0119615, 5 pages; Korean Patent Office, Korea.

* cited by examiner

*Primary Examiner* — Cathy Lam

(74) *Attorney, Agent, or Firm* — Antonelli, Terry, Stout & Kraus, LLP.

(57) ABSTRACT

A bonding structure that a bonding region can endure a high temperature environment and the bonding can be maintained with high reliability is provided as a bonding material capable of maintaining reliable bonding in high temperature environment in place of solder including Pb. In the bonding structure for a first member and a second member, solder and glass are used to bond the first member and the second member together and the glass seals the solder. Thereby, electrical conductivity is ensured and the outflow of melting solder in high temperatures can be inhibited to improve the durability.

11 Claims, 3 Drawing Sheets

BONDING STRUCTURE AND METHOD FOR MANUFACTURING SAME

INCORPORATION BY REFERENCE

The present application claims priority from Japanese application JP2009-281118 filed on Dec. 11, 2009, the content of which is hereby incorporated by reference into this application.

BACKGROUND OF THE INVENTION (1) Field of the Invention

This invention relates to a bonding structure using glass and solder.

(2) Description of the Related Art

Using solder at a junction is known as a related-art bonding form from, for example, JP-A No. 2009-182238 which discloses the use of solder to bond substrates to each other and the use of glass to cover a conductor layer formed on the substrate and the surface of the substrate in order to protect the conductor layer and extend the substrate life.

At present, solder including Pb is employed as a bonding material used for electrical bonding between a substrate and a conductor layer of a functional element in an area exposed to a high temperature environment of 200° C. or higher, such as in an engine room of an automobile. There is, as of now, no technique as an alternative to Sn—Pb solder including 85% or more of Pb as a bonding material capable of resisting a high temperature environment. For this reason, the use of Sn—Pb solder is allowed by the RoHS (Restriction of Hazardous substances) directive which restricts the use of substances which are considered hazardous, such as Pb and the like. However, the use of Sn—Pb solder is expected to be prohibited in the future. A problem in this case is the absence of bonding materials capable of maintaining reliable bonding over a long time period in the high temperature environment of 200° C. or higher, except for Sn—Pb solder. Under the circumstances, a bonding technique to achieve reliable bonding maintained in high temperature environment is required in place of the Sn—Pb solder technique.

SUMMARY OF THE INVENTION

The present invention has been made in view of the above circumstances and provides a bonding form that a bonding region can endure a high temperature environment to maintain reliable bonding.

To attain this, the present invention uses solder and glass to bond a first member and a second member. At this stage, the glass is provided to seal the solder in order for the glass to inhibit the outflow of solder melting in high temperatures.

According to the present invention, since the bonding form is that a solder bonding region is covered with glass, even if solder melts in a high-temperature environment of a solder melting point or higher, the melting solder does not flow out to the surrounding of the bonding region. In consequence, the strength in the bonding region can be maintained in a high temperature environment, enabling bonding between members used in a high temperature environment.

According to the present invention, since the solder bonding region is covered with the glass, improved atmospheric corrosion resistance can be achieved.

BRIEF DESCRIPTION OF THE DRAWINGS

Embodiments of the present invention will be described in detail based on the following drawings, wherein.

DETAILED DESCRIPTION OF THE INVENTION

The following description with reference to FIG. 1 to FIG. 8 is given of a bonding form that a substrate and a substrate are bonded to each other and a substrate and a functional element are bonded to each other and then the bonding region is covered with glass, and a method of producing a bonding material made by covering solder with glass, according to an embodiment of the present invention.

First Embodiment

Bonding of a functional element 1 such as a diode used in a high temperature environment of 200° C. or higher according to the first embodiment of the present invention will be described below with reference to FIG. 1 to FIG. 4.

Figure 2:
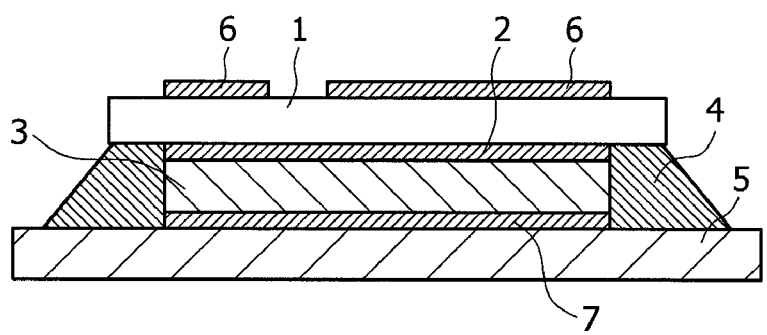
FIG. 2 is a cross-sectional view illustrating a state of a functional element mounted on a substrate, which is a basic structure according to an embodiment of the present invention.

FIG. 2 is a cross sectional view of a bonding structure according to an embodiment of the present invention. A functional element 1 is bonded to a substrate 5 by solder 3 and glass 4. The functional element 1 is, for example, a SiC-based power semiconductor, on the main surfaces of which electric conductor layers 2, 6 are formed. The substrate 5 is, for example, a SiC-based substrate, or a substrate excelling in heat radiation properties such as a metal core substrate. A conductor layer 7 is formed on a main surface of the substrate 5 facing the functional element 1. In the embodiment, the conductor layer 7 on the substrate 5 and the conductor layer 2 on the functional element 1 are electrically connected to each other by bonding the substrate 5 and the functional element 1 together with solder. Further, the solder 3 in the bonding region is covered with the glass 4 in order to make it possible to achieve satisfactory heat radiation properties and maintain bonding reliability over a long time period even in an end-use environment temperature of 200° C. or higher. The glass 4 also bonds the substrate 5 and the functional element 1 together, and further encloses the solder 3. The glass is a glass frit, a glass paste or the like, which is known as a bonding member/a sealing member and also known to provide robust bonding with high heat resistance. However, since the glass has low electric conductivity, it cannot be employed as a conductor. In the embodiment, the solder 3 provides ensured electric conductivity, and the glass 4 encloses the solder for bonding, resulting in increased heat resistance. For example, by using the glass 4 as a material with a higher melting point than that of the solder 3, even if the solder 3 melts, the solder 3 does not flow out at once because the glass 4 encloses the solder 3. Then, as temperature decreases, the solder 3 solidifies and returns to its immediately previous state. Accordingly, bonding using the solder 3 and the glass 4 makes it possible to improve the durability and the heat resistance.

Note that the embodiment describes the substrate 5 and the functional element 1 as members to be connected, but members to be connected are not limited to them. Other members can be applied as long as two members or more are bonded together. The functional element 1 is not limited to the power semiconductor. Various types of functional elements can be applied. In, of them, the types of functional elements tending to generate heat such as a power semiconductor and the like, in particular, an advantage effect of high heat resistance can be exhibited. In turn, the power semiconductor is not limited to a SiC semiconductor, and a GaN semiconductor or the like can be applied. Since the solder and the glass used are Pb-free solder and Pb-free glass, the use of the bonding structure will not be limited even after the RoHS restricts the use of Sn—Pb solder. In order to deliver electric power to the power semiconductor which is the functional element 1 from the outside and radiate the heat generated by the power semiconductor, the first conductor layer 2, the second conductor layer 6 and the third conductor layer 7 are formed of a metal including Cu or a Cu alloy, Al or an Al alloy, and Ni or a Ni alloy, or a metal including Au or an Au alloy.

Next, a rough outline of the process of forming a bonding structure according to the embodiment will be described.

Figure 1:
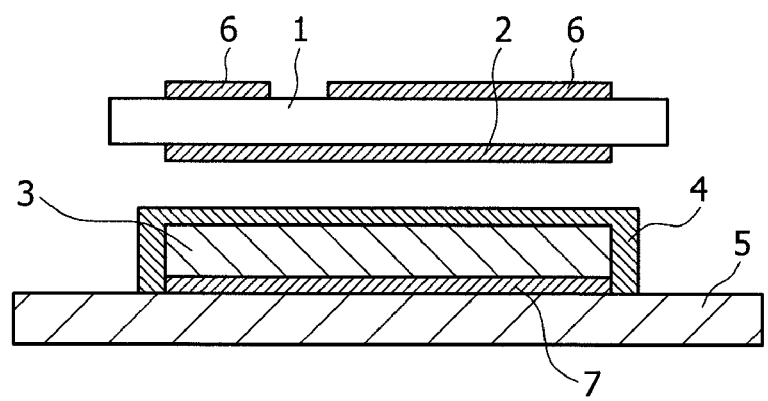
FIG. 1 is a cross-sectional view illustrating a state before a functional element is mounted on a substrate according to an embodiment of the present invention.
Figure 3:
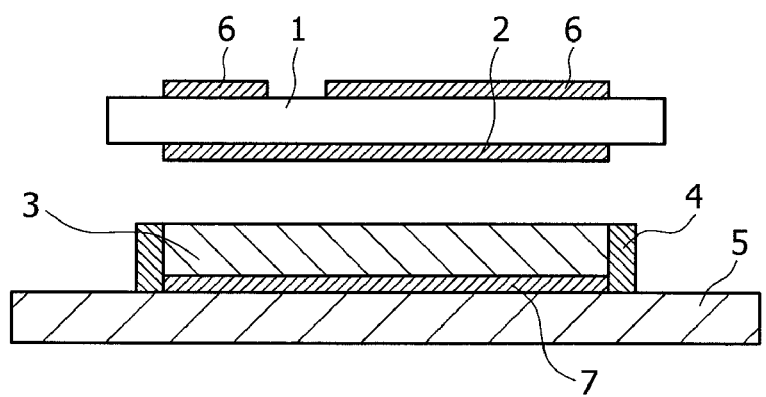
FIG. 3 is a cross-sectional view illustrating a state before a functional element is mounted on a substrate, which is a basic structure according to an embodiment of the present invention, in which glass formed on solder is partially removed.
Figure 4:
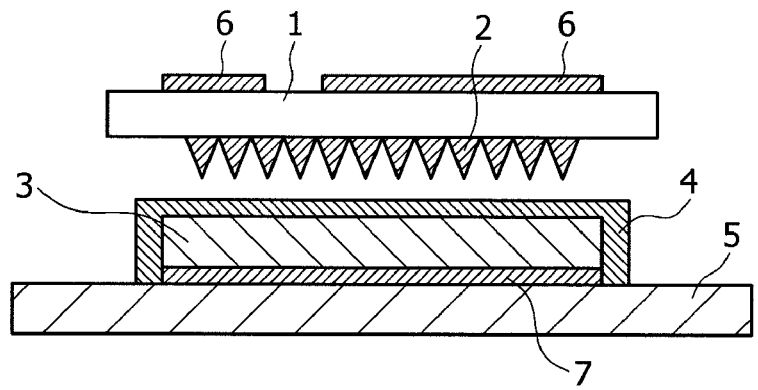
FIG. 4 is a cross-sectional view illustrating a state before a functional element is mounted on a substrate, which is a basic structure according to an embodiment of the present invention, in which a conductor layer with an uneven shape is formed on part of a conductor layer formed on the bonding surface of the functional element.

FIG. 1 is a cross-sectional view before the functional element 1 is mounted on the substrate 5. FIG. 3 is a cross-sectional view of the state in which the portion of the glass 4 on the bonding surface of the solder 3 is removed before the functional element 1 is mounted on the substrate 5. FIG. 2 is a cross-sectional view of the completed bonding structure after the functional element 1 is mounted on the substrate 5. FIG. 4 is a cross-sectional view of the state before the functional element 1 is mounted on the substrate 5, in which the conductor layer 2 having an uneven shape is formed on part of the bonding surface of the functional element 1.

First, the third conductor layer 7 intended to serve as an electrode is formed on the bonding surface of the substrate 5 by a semiconductor process using photolithography techniques. Then, the solder 3 is formed on the conductor layer 7 by the use of vapor-deposition, sputtering, plating or screen printing techniques. Then, the glass 4 is printed by the use of screen printing techniques to fully cover the solder thus formed. Then, the substrate 5 with the glass 4 printed is left in a temperature environment from about 100° C. to about 150° C. to dry the glass 4. Then, before bonding of the power semiconductor which is the functional element 1, a portion of the glass 4 located on the main surface to be bonded to the functional element 1 is removed by polishing or the like to expose the solder 3 as shown in FIG. 3. By doing so, when the power semiconductor is bonded to the substrate 5, the first conductor 2 formed on the power semiconductor makes in contact with the exposed portion of the solder 3. Then, the substrate 5 and the functional element 1 are heated and a temperature at which the glass 4 can bond the power semiconductor and the substrate 5 together is maintained, so that the substrate 5 and the functional element 1 are bonded together. Then, they are cooled. As a result, the bonding using the glass 4 and the metallic bonding using the solder 3 can be simultaneously achieved. At this stage, since the solder 3 melts by the heating, but the glass 4 softens and does not completely melt, the amount of mixing of the solder 3 and the glass 4 is very small, thus achieving bonding produced by the solder 3 and the glass 4 independently. The glass has a higher durable temperature than its connectable temperature, resulting in a completed connection structure with high heat resistance.

Before the power semiconductor which is the functional element is bonded, the first conductor layer 2 may be formed in an uneven shape as illustrated in FIG. 4, and therefore the process of removing the glass may be omitted. The uneven shape is formed by suitably using transfer printing, nanoimprint technology, or wet etching using solution. The thickness of the uneven shape is preferably greater than that of the glass 4 on the solder 3. As a result, when the power semiconductor is heated for being bonded to the substrate 5, the projections of the first conductor layer 2 break through the softening glass 4, so that the first conductor layer 2 comes into contact with the solder 3, and finally the power semiconductor is bonded to the substrate 5 by the glass 4.

According to the present invention, because of the bonding form having a solder bonding region covered with glass, if the solder melts in a high-temperature environment of a solder melting point or higher, the solder does not flow out to the surrounding of the solder bonding region, thus making it possible to achieve the bonding between members which are used in high-temperature environments.

According to the present invention, a solder bonding region is covered with glass and bonding in the surrounding of the solder bonding region is provided by the glass. As a result, even if the solder melts in a high-temperature environment, the glass can maintain the strength of the bonding region. This eliminates a need to use a underfill for the purpose of reinforcing the strength of the bonding region, leading to a reduction in costs of underfill materials and an omission of a process of injecting a underfill into a bonding region.

According to the present invention, because of the bonding form having a solder bonding region covered with glass, if the solder melts in a high-temperature environment of a solder melting point or higher, the solder does not flow out to the surrounding of the solder bonding region. Accordingly, the solder may remains in a state in which it has melted in the high-temperature environment.

It is possible to reduce the thermal stress caused by a difference between thermal expansion coefficients of bonded materials.

Second Embodiment

Next, the second embodiment according to the present invention will be described with reference to FIGS. 5 to 8. The second embodiment differs from the first embodiment in that, instead of the bonding produced by use of the solder 3, bonding is produced by use of bump-shaped bonding metals (solder or metal) 8.

Figure 5:
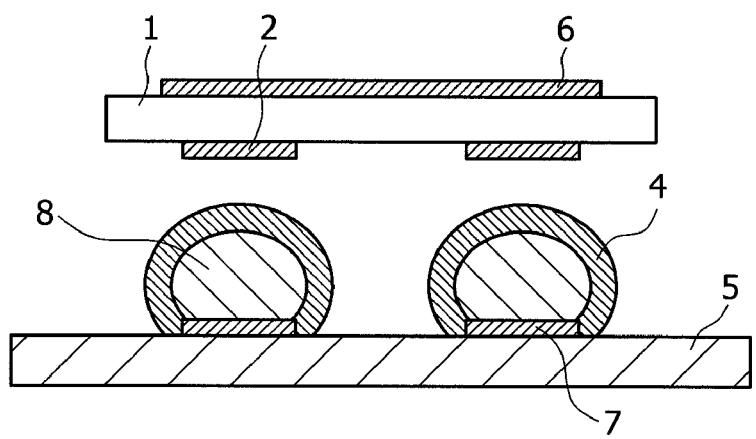
FIG. 5 is a cross-sectional view illustrating a second embodiment of the present invention.
Figure 6:
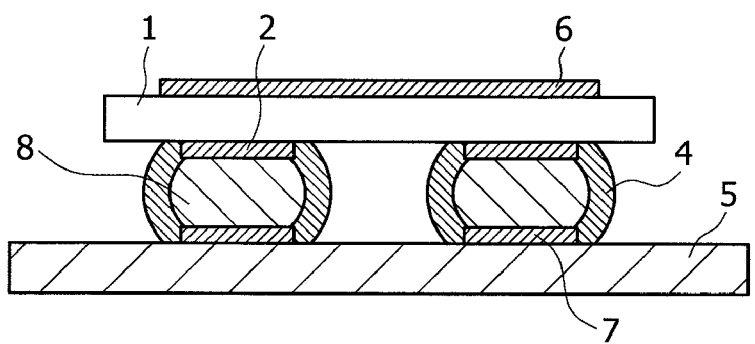
FIG. 6 is a cross-sectional view illustrating a second embodiment of the present invention.
Figure 7:
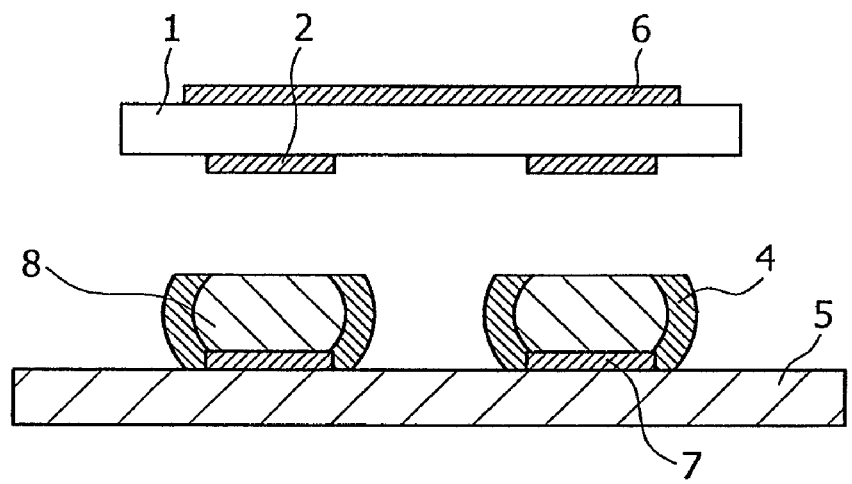
FIG. 7 is a cross-sectional view illustrating a second embodiment of the present invention.
Figure 8:
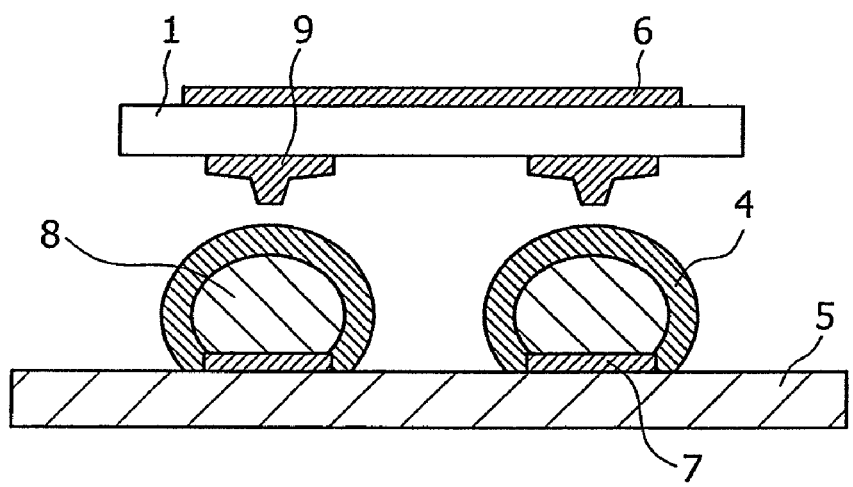
FIG. 8 is a cross-sectional view illustrating a second embodiment of the present invention.

FIG. 5 is a cross-sectional view before the functional element 1 is mounted on the substrate 5. FIG. 6 is a cross-sectional view after the functional element 1 is mounted on the substrate 5. FIG. 7 is a cross-sectional view illustrating the state in which a portion of the glass 4 is removed from the bonding surface of the bump-shaped solder or metal 8 before the functional element 1 is mounted on the substrate 5. FIG. 8 is a cross-sectional view illustrating the functional element 1 before being mounted on the substrate 5, in which conductor layers 9 each formed in an uneven shape are formed on part of the bonding surface of the functional element 1.

In the completed bonding structure, as shown in FIG. 6, the substrate 5 and the functional element 1 are bonded together by the pieces of the glass 4 and the bump-shaped bonding members 8 which are respectively enclosed by the pieces of the glass 4. Accordingly, the bonding structure has high durability and high heat resistance as in the case of the first embodiment. Further, since bonding is produced by use of a plurality of bonding metal members 8, the bonding structure can be suitably used for fine wiring pattern.

In the method of manufacturing the bonding structure in the embodiment, as in the case of the first embodiment, the bonding metal 8 is formed on the substrate 5, and then the glass 4 is formed on the bonding metal 8. Then, as illustrated in FIG. 7, each piece of the glass 4 is partially removed. Then, the bonding metal 8 and the glass 4 are fused by heating so that the functional element 1 is bonded. In this regard, as illustrated in FIG. 8, each conductor layer 9 formed on the functional element 1 is formed as a metal of a bump shape with a sharp leading-end. By doing so, the bump shape can break through the glass to produce bonding, making it possible to omit a process of partially removing the glass 4.

By designing the second embodiment as described above, the bonding structure can be provided for forming of a fine wiring pattern.

Third Embodiment

Next, the third embodiment according to the present invention will be described. In the third embodiment, an Ag film or an Au film is further formed on the surface of the solder 3 described in the first embodiment and the second embodiment. In the case of the Ag film being formed, an Au film is further formed on the Ag film to prevent oxidation of the solder surface. When having a thickness of about 0.1 µm, the Ag film exercises the ability to prevent oxidation, which, in particular, is a technique effective for a non-flux connection process. However, forming the Ag film or the Au film is not essential. For example, when flux can be used, when a good connection can be achieved without prevention of oxidation of the solder surface, or the like, forming the Ag film or the Au film is not always necessary.

As described above, according to the third embodiment, there are not necessities to coating the solder with flux serving a function of improving the solder wettable properties and to clean the flux. This makes it possible to prevent flux residue from corroding the wiring to cause a failure of the electronic component.

It should be understood by those skilled in the art that various modifications, combinations, sub-combinations, and alterations may occur depending on design requirements and other factors insofar as they are within the scope of the appended claims or the equivalents thereof.

What is claimed is:

1. A bonding structure that provides solder bonding between a first member and a second member, comprising:
   solder making connection between a first member and a second member; and
   glass sealing the solder,
   wherein the first member and the second member are bonded together by the solder, and the first member and the second member are bonded together by the glass.

2. The bonding structure according to claim 1, wherein the solder is entirely covered with the first member, the second member and the glass.

3. The bonding structure according to claim 1, wherein the first member and the second member respectively comprise conductor layers provided on portions of the first member and the second member bonded to the solder.

4. The bonding structure according to claim 3, wherein materials used for the conductor layers of the first member and the second member are at least one selected from the group consisting of Cu, Cu alloy, Al, an Al alloy, Ni, a Ni alloy, Au and an Au alloy.

5. The bonding structure according to claim 1, wherein one of an Ag film, an Au film and a multilayer film of Ag and Au is formed on the surface of the solder used in a bonding form.

6. The bonding structure according to claim 5, wherein one of the Ag film, the Au film and the multilayer film of Ag and Au is formed on the surface of the solder by vapor-deposition, sputtering or plating.

7. The bonding structure according to claim 1, wherein a plurality of members of the solder and a plurality of pieces of the glass sealing the plurality of members of the solder are formed between the first member and the second member.

8. The bonding structure according to claim 1, wherein the first member is a substrate, and the second member is a functional element.

9. The bonding structure according to claim 1, wherein the solder is Pb-free.

10. The bonding structure according to claim 1, wherein the glass is Pb-free.

11. The bonding structure according to claim 1, wherein the solder is at least one bump-shaped member enclosed by the glass, the first member, and the second member.

* * * * *